US 6,745,280 B2

(12) United States Patent
Darnell et al.

(10) Patent No.: US 6,745,280 B2
(45) Date of Patent: Jun. 1, 2004

(54) CONTENT ADDRESSABLE MEMORIES HAVING ENTRIES STORED THEREIN WITH INDEPENDENTLY SEARCHABLE WEIGHT FIELDS AND METHODS OF OPERATING SAME

(75) Inventors: Brian Scott Darnell, Rockwall, TX (US); John Fowler, Plano, TX (US)

(73) Assignee: Integrated Device Technology, Inc., Santa Clara, CA (US)

( * ) Notice: Subject to any disclaimer, the term of this patent is extended or adjusted under 35 U.S.C. 154(b) by 194 days.

(21) Appl. No.: 10/109,328

(22) Filed: Mar. 28, 2002

(65) Prior Publication Data

US 2003/0188090 A1 Oct. 2, 2003

(51) Int. Cl.⁷ .............................................. G06F 12/00
(52) U.S. Cl. ........................................ 711/108; 365/49
(58) Field of Search ............................ 711/108; 365/49; 370/230, 408

(56) References Cited

U.S. PATENT DOCUMENTS

| 4,723,224 | A | | 2/1988 | Van Hulett et al. | 365/49 |
| 5,422,838 | A | | 6/1995 | Lin | 365/49 |
| 5,920,886 | A | * | 7/1999 | Feldmeier | 711/108 |
| 5,999,435 | A | | 12/1999 | Henderson et al. | 365/49 |
| 6,014,367 | A | | 1/2000 | Joffe | 370/230 |
| 6,081,440 | A | | 6/2000 | Washburn et al. | 365/49 |
| 6,154,384 | A | | 11/2000 | Nataraj et al. | 365/49 |
| 6,175,514 | B1 | | 1/2001 | Henderson et al. | 365/49 |
| 6,181,592 | B1 | | 1/2001 | Aoki | 365/49 |
| 6,237,061 | B1 | | 5/2001 | Srinivasan et al. | 711/108 |
| 6,324,087 | B1 | | 11/2001 | Pereira | 365/49 |
| 6,415,354 | B1 | * | 7/2002 | Joffe et al. | 711/108 |
| 6,502,163 | B1 | | 12/2002 | Ramankutty | 711/108 |
| 6,542,391 | B2 | * | 4/2003 | Pereira et al. | 365/49 |
| 6,591,331 | B1 | * | 7/2003 | Khanna | 711/108 |
| 6,633,953 | B2 | * | 10/2003 | Stark | 711/108 |
| 2002/0131432 | A1 | | 9/2002 | Bachmutsky et al. | 370/408 |
| 2003/0058671 | A1 | * | 3/2003 | Lindahl et al. | 365/49 |

* cited by examiner

Primary Examiner—Nasser Moazzami
(74) Attorney, Agent, or Firm—Myers Bigel Sibley & Sajovec (57) ABSTRACT

A content addressable memory (CAM) device includes a CAM array that has multiple entries therein that are arranged in groups by weight class. Each entry comprises data bits and independently searchable weight bits that identify the weight class of the entry.

9 Claims, 11 Drawing Sheets

| | Data | Weight | Validity |
|---|---|---|---|
| | Data H | 29 | 1 |
| • | • | • | |
| 0x07fd | Data A | 30 | 1 |
| 0x07fe | Data B | 30 | 1 |
| 0x07ff | Data C | 30 | 0 |
| 0x0800 | Data D | 29 | 1 |
| 0x0801 | Data E | 29 | 1 |
| 0x0802 | Data F | 29 | 1 |
| 0x0803 | Data G | 28 | 1 |
| • | • | • | |

| Address | Data | Weight |
|---|---|---|
| 0x0000 | Key 1 | 31 |
| 0x0001 | Key 2 | 31 |
| 0x0002 | Key 3 | 31 |
| | ● | |
| 0x0800 | Key 2048 | 30 |
| 0x0801 | Key 2049 | 30 |
| 0x0802 | Key 2050 | 30 |
| | ● | |
| 0x1000 | Key 4096 | 29 |
| 0x1001 | Key 4097 | 29 |
| 0x1002 | Key 4098 | 29 |
| | ● | |
| 0xFFFF | Key 65536 | 0 |

*FIG. 6*

| Address | Data | Weight | Table |
|---|---|---|---|
| 0x0000 | Key 1 | 31 | 0 |
| 0x0001 | Key 2 | 31 | 0 |
| 0x0002 | Key 3 | 31 | 0 |
| | ● | | |
| 0x0400 | Key 1024 | 30 | 0 |
| 0x0401 | Key 1025 | 30 | 0 |
| 0x0402 | Key 1026 | 30 | 0 |
| | ● | | |
| 0x0800 | Key 2048 | 29 | 0 |
| 0x0801 | Key 2049 | 29 | 0 |
| 0x0802 | Key 2050 | 29 | 0 |
| | ● | | |
| 0x8000 | Key 32768 | 0 | 0 |
| 0x8001 | Key 32769 | 31 | 1 |
| 0x8002 | Key 32770 | 31 | 1 |
| 0x8003 | Key 32771 | 31 | 1 |
| | ● | | |
| 0x8400 | Key 33792 | 30 | 1 |
| 0x8401 | Key 33793 | 30 | 1 |
| 0x8402 | Key 33794 | 30 | 1 |
| | ● | | |
| 0x8800 | Key 34816 | 29 | 1 |
| 0x8801 | Key 34817 | 29 | 1 |
| 0x8802 | Key 34818 | 29 | 1 |
| | ● | | |
| 0xFFFF | Key 65536 | 0 | 1 |

*FIG. 7*

| Address | Data | Weight | Table |
|---|---|---|---|
| 0x0000 | Key 1 | 31 | 0 |
| 0x0001 | Key 2 | 31 | 1 |
| 0x0002 | Key 3 | 31 | 0 |
| | ● | | |
| 0x0400 | Key 1024 | 30 | 1 |
| 0x0401 | Key 1025 | 30 | 0 |
| 0x0402 | Key 1026 | 30 | 1 |
| | ● | | |
| 0x0800 | Key 2048 | 29 | 0 |
| 0x0801 | Key 2049 | 29 | 1 |
| 0x0802 | Key 2050 | 29 | 0 |
| | ● | | |
| 0x8000 | Key 32768 | 16 | 1 |
| 0x8001 | Key 32769 | 15 | 0 |
| 0x8002 | Key 32770 | 15 | 1 |
| 0x8003 | Key 32771 | 15 | 0 |
| | ● | | |
| 0x8400 | Key 33792 | 14 | 1 |
| 0x8401 | Key 33793 | 14 | 0 |
| 0x8402 | Key 33794 | 14 | 1 |
| | ● | | |
| 0x8800 | Key 34816 | 13 | 0 |
| 0x8801 | Key 34817 | 13 | 1 |
| 0x8802 | Key 34818 | 13 | 0 |
| | ● | | |
| 0xFFFF | Key 65536 | 0 | 1 |

|  | Data | Weight | Validity |
|---|---|---|---|
|  | Data D | 29 | 1 |

| | Data | Weight | Validity |
|---|---|---|---|
| 0x0800 | Data A | 29 | 0 |
| 0x0801 | Data B | 29 | 1 |
| 0x0802 | Data C | 29 | 1 |

FIG. 12

|  | Data | Weight | Validity |
|---|---|---|---|
|  | Data H | 29 | 1 |

| | Data | Weight | Validity |
|---|---|---|---|
| 0x07fd | Data A | 30 | 1 |
| 0x07fe | Data B | 30 | 1 |
| 0x07ff | Data C | 30 | 0 |
| 0x0800 | Data D | 29 | 1 |
| 0x0801 | Data E | 29 | 1 |
| 0x0802 | Data F | 29 | 1 |
| 0x0803 | Data G | 28 | 1 |

CONTENT ADDRESSABLE MEMORIES HAVING ENTRIES STORED THEREIN WITH INDEPENDENTLY SEARCHABLE WEIGHT FIELDS AND METHODS OF OPERATING SAME

BACKGROUND OF THE INVENTION

The present invention relates generally to the field of memory devices and, more particularly, to content addressable memory (CAM) devices and methods of operating same.

In many memory devices, including random access memory (RAM) devices, data is typically accessed by supplying an address to an array of memory cells and then reading data from the memory cells that reside at the supplied address. In content addressable memory (CAM) devices, however, data within a CAM array is not accessed by initially supplying an address, but rather by initially applying data to the array and then performing a compare operation to identify one or more locations within the array that contain data equivalent to the applied data and thereby represent a "match" condition. In this manner, data may be accessed according to its content in addition to being accessible by its address. Upon completion of the compare operation, the identified location(s) containing equivalent data is typically encoded to provide an address at which the equivalent data is located. If multiple locations are identified in response to the compare operation, then priority encoding operations may be performed to identify a best or highest priority match. Such priority encoding operations frequently use the physical locations of multiple matches within the CAM array to identify a highest priority match. Exemplary CAM cells and CAM memory devices are more fully described in U.S. Pat. Nos. 5,706,224, 5,852,569 and 5,964,857 to Srinivasan et al. and U.S. Pat. Nos. 6,101,116, 6,256,216 and 6,128,207 to Lien et al., assigned to the present assignee, the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition regardless of the value of the applied data bit versus the stored data bit. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array having a plurality of entries therein of width N, then a compare operation will yield one or more entry match conditions whenever all the unmasked data bits of a word stored in the ternary CAM array are identical to the corresponding data bits of the applied word. This means that if the applied data word equals {1011}, the following stored words will result in an entry match condition in a CAM comprising ternary CAM cells (i.e., a ternary CAM): {1011}, {X011}, {1X11}, {10X1}, {101X}, {XX11}, {1XX1}, . . . , {1XXX}, {XXXX}.

Figure 1:
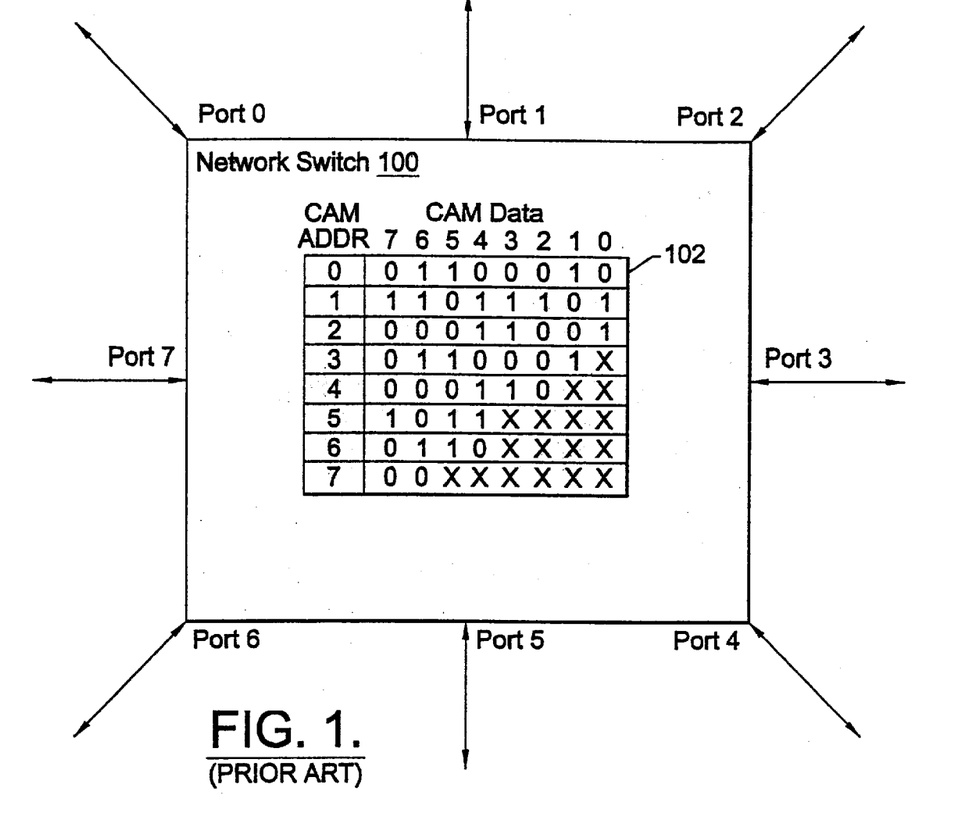
FIG. 1 is a block diagram of a network switch according to the prior art.

Applications using CAMs include database management, disk caching, pattern and image recognition and artificial intelligence. CAMs are also well suited for use in routing network traffic, such as in network address lookup or packet switching. For example, FIG. 1 illustrates a simplified view of a network switch 100. The network switch 100 may communicate with a network through a plurality of network ports, shown as ports zero through seven. The switch 100 may receive network traffic on one port and determine to which of its other ports that traffic should be routed. As will be understood by those skilled in the art, the network traffic may include a packet stream of data containing a leading destination address. The network switch 100 may select a leading portion of the packet stream and provide it to a ternary CAM 102. The CAM 102 may contain entries that include predetermined routing information, with the CAM address of each of these entries designating a port of the network switch 100. When the portion of the packet stream is applied as data to the CAM 102 during a compare operation, the CAM 102 may return a CAM address. This CAM address may correspond to the location of an entry within the CAM 102 that matches the applied portion of the packet stream. This returned CAM address may then be used by the network switch 100 as a pointer to acquire routing information from a second memory device to direct the packet stream to a desired port that will enable the packet stream to reach its destination address.

Figure 2:
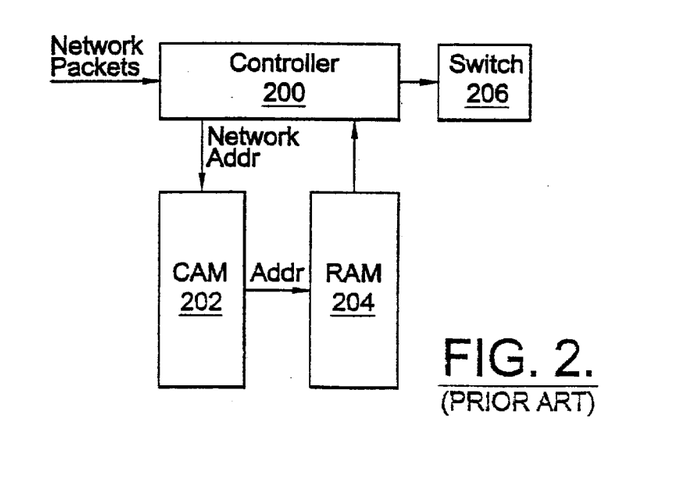
FIG. 2 is a block diagram of a network routing system according to the prior art.

Referring now to FIG. 2, a conventional network routing application may also use a switch controller 200 that receives network packets from an external source and routes the network packets through a switch 206. The switch controller 200 may provide a portion of a destination address within a packet to an accompanying CAM 202. In response, the CAM 202 may perform a compare operation and generate an address of a matching entry. This generated address may be used as a pointer to acquire network address translation information or other routing information contained within a RAM 204. The information provided by the RAM is then conveyed to the controller 200 for use in routing the packet through the switch 206. In this manner, a CAM 202 may be used to provide a mechanism for locating address translation and routing information for network packet addresses.

In the event multiple matches (i.e., multiple matching entries) are detected during a compare operation, conventional physical priority encoding techniques may be used to identify a best or highest priority match (i.e., a highest priority matching entry) that should be used to perform the routing of the packet stream in a preferred manner. This highest priority match is frequently referred to as a longest prefix match (LPM), where the prefix may be defined as a first portion of a network packet address. A conventional technique for identifying an LPM will now be described with reference to the entries illustrated within the CAM 102 of FIG. 1. If the destination address within the packet stream is a bit sequence equal to {01100010}, then a compare operation within the CAM 102 of FIG. 1 will result in three matches. These three matches correspond to the entries at address 0, designating port 0, address 3, designating port 3, and address 6, designating port 6. As illustrated by the entries within the CAM 102, the match corresponding to the entry at address 0 may be treated as the highest priority match because it is the entry with the largest number of unmasked data bits that are equivalent to the applied destination address. The detection of this highest priority match can be relatively simple if the entries within the CAM 102 are presorted according to priority or are arranged within sectors, with each sector containing entries having the same number of unmasked bits and being physically arranged according to priority. As described herein, sectors within a CAM may have the same or different number of entries therein.

As illustrated by FIG. 1, entries having no masked bits may be stored in a first sector (illustrated as spanning addresses 0–2 within the CAM 102) and entries having only one masked bit may be stored in a second sector (illustrated as spanning only address 3 within the CAM 102). Entries having a greater number of masked bits are also stored in respective lower priority sectors within the CAM 102. By intentionally arranging all entries having the same number of masked bits within the same sector and by physically locating the sectors in order of their priority within the CAM 102, a simple physical encoding technique may be used to identify the highest priority match as the match having the highest number of unmasked bits relative to the other matches. This technique typically includes selecting the match that is in the highest relative priority sector in the event matches within multiple sectors are present. If multiple matches are present within the same highest relative priority sector, then any of the equivalent matches may be selected as the "best" match. Typically, however, the matching entry at the lowest address is selected as the "best" match.

U.S. Pat. No. 6,237,061 to Srinivasan et al., entitled "Method For Longest Prefix Matching in a Content Addressable Memory," discloses a conventional arrangement of locally masked entries that need not be stored in equivalently sized sectors or blocks within a CAM, but nonetheless are stored by loading a plurality of Class-less Inter-Domain Routing (CIDR) addresses into respective ones of a plurality of CAM entries in a predetermined order such that increasing numerical CAM entry addresses correspond to CIDR addresses having decreasing prefix values (i.e., a greater number of actively masked bits). If a compare operation is then performed and a matching entry within the preordered CAM is present, a suitable match flag signal is asserted, and the index of the matching CAM entry (as well as any associated routing data stored in the CAM or in an external memory such as an SRAM array) is provided as an output. Alternatively, if there are multiple matching entries in the CAM, a suitable multiple match flag signal is asserted and, in response thereto, an associated priority encoder that is coupled to the CAM outputs the highest priority location. This highest priority location corresponds to the CAM entry having the lowest index, which by definition is the longest prefix matching entry.

Partitioning a CAM into a plurality of prioritized sectors may limit the flexibility of the CAM because the content of the CAM may need to be presorted into appropriate sectors according to mask length. Because the sectors are frequently partitioned into arrays of equal size to accommodate a variety of different applications, and because the number of entries required in each sector may be constantly changing during operation, it may not be possible to partition a CAM into fixed sized sectors that do not result in a significant number of unused entry locations. For example, if a CAM is divided into 16 equal sectors to support entries having as many as 15 actively masked bits and each sector is the same size, then much of the CAM may go unused if many of the sectors are only partially filled with entries of a respective mask length. Furthermore, it may not be practical to divide a CAM array into more than a relatively small number M of equally sized sectors because the size of each sector scales as 1/M, some applications may require a large number of priority levels (i.e., large M) and the number of entries at a given priority level may exceed H/M, where H is the height of the CAM (e.g., total number of rows in the CAM array). Finally, even if the CAM is not arranged into equivalently sized sectors, the loading of entries into the CAM in a predetermined order, such that increasing (or decreasing) CAM entry addresses correspond to entries having decreasing (or increasing) prefix values, may require time consuming operations to reload the CAM be performed when new entries having different prefix values are added to the CAM.

Another priority resolution scheme that may be used to select a best match when a database search returns multiple matches involves assigning a weight parameter to each database entry. The weight parameter defines the importance of an entry relative to all other entries in the database. When an entry is added to the database, a second value is written to another database or look-up table that defines that entry's weight. When a database search returns multiple matching entries, the entry that is associated with the highest weight value is selected as the best match.

Thus, notwithstanding the relative simplicity of determining highest priority matches using conventional physical priority encoding techniques, additional techniques are needed that do not require presorting of entries and do not result in significant amounts of unused CAM space.

SUMMARY OF THE INVENTION

According to some embodiments of the present invention, a content addressable memory (CAM) device comprises a CAM array that has multiple entries therein that are arranged in groups by weight class. Each entry comprises data bits and independently searchable weight bits that identify the weight class of the entry. In other embodiments, each entry may comprise one or more table bits, which may be used to define logical tables within the CAM array. The entries within a weight class may be randomly arranged or grouped according to table bit value. Each entry may also comprise one or more validity bits, which indicate whether the entry is in a valid or invalid state. The validity bit(s) may be used to facilitate maintenance of the CAM array as invalid bits may be overwritten with new entries. The data bits may represent an entry value or key, and one or more of the data bits may be actively masked during look-up operations. The CAM entries may be distributed evenly among the groups and/or weight classes or, alternatively, the groups and/or weight classes may have different weight depths (i.e., different numbers of entries).

In further embodiments of the present invention, a CAM array may be searched according to a weight class of a new entry and/or search word to identify a location of one or more entries in the CAM array that are assigned to the same weight class as the new entry. Because the weight bits may be independently searched, one or more of the identified entries may not entirely match the new entry and/or search word. In particular embodiments of the present invention, the CAM array may be searched by applying weight class bits of the new entry and/or search word as differential signals to a first plurality of pairs of differential comparand lines in the CAM array, and applying mask bits to a second plurality of pairs of differential comparand lines in the CAM array that span a data field of each of the entries in the CAM array. These comparand lines may also be referred to as data lines or bit lines.

In still further embodiments of the present invention, a CAM array may be updated by searching the CAM array according to weight class and validity status to identify a location of an empty entry assigned to the same weight class as a new entry. The new entry may then be written into the identified location. It may be determined, however, that there are no empty entries assigned to the same weight class as the new entry. Therefore, in other embodiments of the present invention, the CAM array may be searched according to weight class to identify the top and/or bottom boundary of a weight class block that matches the weight class of a new entry. The weight class block may then be expanded to make room for the new entry.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

Figure 3:
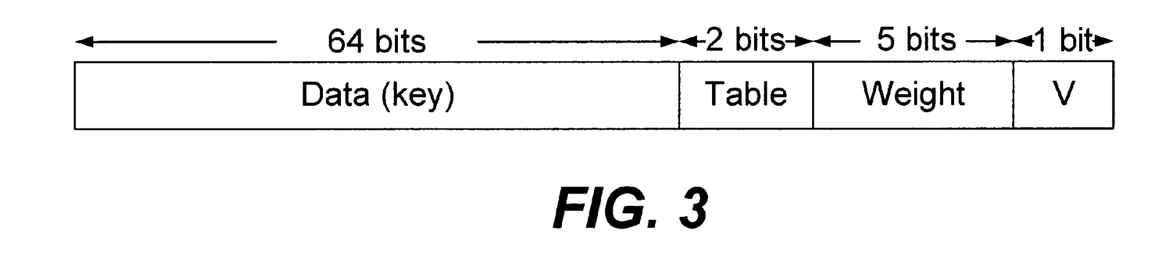
FIG. 3 is a block diagram that illustrates an exemplary entry that may be stored in a CAM in accordance with embodiments of the present invention.

Referring now to FIG. 3 an exemplary format for content addressable memory (CAM) entries in a CAM device having at least one CAM array therein, in accordance with embodiments of the present invention, is illustrated. The entry format may comprise four fields: a data field, which may be used as an entry value or key value, a table field, a weight field, and a validity (V) field. Each of these fields may be independently or collectively searched during a look-up operation. The data field may be used, for example, to store an IP address. The table field may be used to create logical databases within the CAM as will be described in more detail below. The weight field may be used to store a weight value assigned to the entry. As discussed above, the weight value assigned to an entry specifies the priority class of that entry relative to other entries in the CAM. Absolute priority is a function of class and, for example, position within the class and/or a weight assigned to a table value within the class. The validity field may be used to indicate whether an entry is currently active and should be included in search and/or lookup queries, or whether the entry is inactive and may be replaced when a new entry is written into the CAM. The validity field may provide improved maintenance of the CAM. For example, unlike conventional positional priority based CAMs, a mapping of where specific entries are located in the CAM and how they are arranged relative to priority need not be maintained. To store a new entry associated with a specific weight class, a search may be performed on the CAM for entries belonging to that weight class and having a validity bit indicating that the entry is inactive. If an entry is found meeting these search criteria, then the existing entry may be overwritten with the new entry.

The numbers of bits assigned to the four fields shown in FIG. 3 are merely exemplary. Factors such as the size of the CAM, the number of logical databases to be created within the CAM, and the number of weight classifications may be used to determine the number of bits to allocate for each field.

Figure 4:
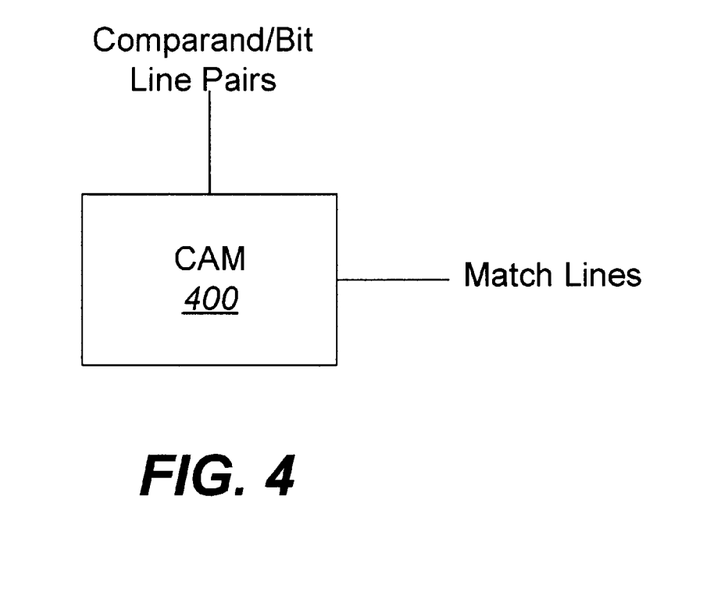
FIG. 4 is a block diagram that illustrates a content addressable memory (CAM) architecture in accordance with embodiments of the present invention.

FIG. 4 is a high level block diagram of a CAM 400 in accordance with embodiments of the present invention. The CAM 400 may store entries therein as described above with respect to FIG. 3. The CAM 400 further comprises a plurality of comparand/bit line pairs, which are respectively associated with columns of cells in the CAM 400 corresponding to the bit positions of the CAM entries. To perform a compare operation, differential signals representing search data or information may be applied to one or more of the comparand/bit line pairs. In addition, it may be desirable to perform a search based on a portion of a CAM entry. In this case, the other portions, which are not the subject of the search, may be excluded from the search by masking those bit positions. This masking operation may be performed by driving the comparand/bit line pairs to the same logic value (e.g., logic 0) to preclude compare circuitry within a column of CAM cells from becoming active. The CAM 400 will indicate a match at each masked bit position regardless of the data stored at that position. Note also that in accordance with other embodiments of the present invention, the CAM 400 may be a ternary CAM in which each entry may have one or more mask bits associated therewith. In this case, the CAM 400 will indicate a match for a masked bit position regardless of the data stored in that bit position. Thus, a new entry and/or search word may be applied as differential signals to the comparand/bit line pairs. In response, the CAM 400, for example, pulls down match lines corresponding to those entries in the CAM 400 that do not match the new entry and/or search word to a logic 0 level so that the match lines that remain at a logic 1 level identify the matching entries.

The present invention is described hereinafter with reference to flowchart and/or block diagram illustrations of methods, CAMs, and/or computer program products in accordance with exemplary embodiments of the invention. It will be understood that each block of the flowchart and/or block diagram illustrations, and combinations of blocks in the flowchart and/or block diagram illustrations, may be implemented by computer program instructions. These computer program instructions may be provided to a processor of a general purpose computer, a special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer usable or computer-readable memory that may direct a computer or other programmable data processing apparatus to function in a particular manner, such that the instructions stored in the computer usable or computer-readable memory produce an article of manufacture including instructions that implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions that execute on the computer or other programmable apparatus provide steps for implementing the functions/acts specified in the flowchart and/or block diagram block or blocks.

Figure 5:
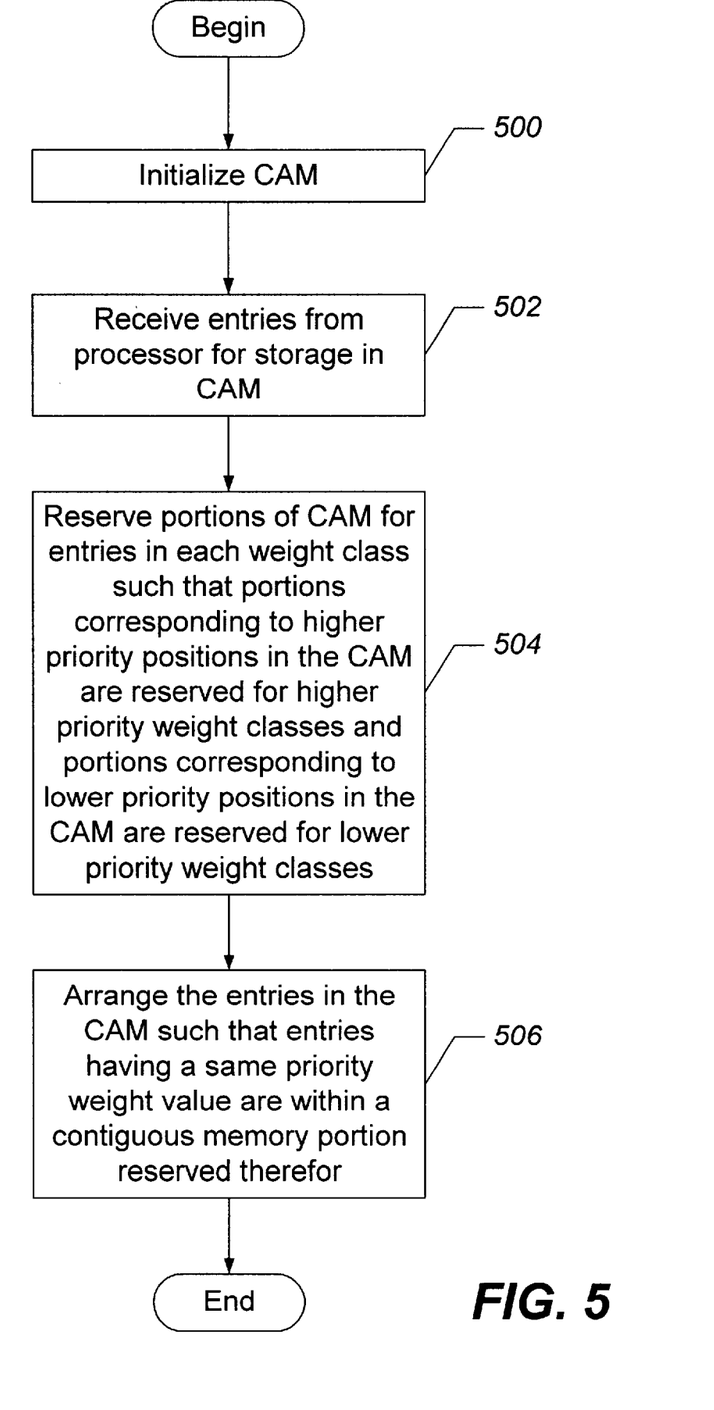
FIG. 5 is a flowchart that illustrates operations of a CAM having entries with independently searchable weight fields stored therein in accordance with embodiments of the present invention.

Exemplary operations of CAMs and methods of operating same, in accordance with embodiments of the present invention, will be described hereafter. Referring now to FIG. 5, operations begin at block 500 with initialization of the CAM. At block 502, the CAM receives entries from a processor for storage therein. According to embodiments of the present invention, each entry comprises a data field and a weight field as described above with respect to FIG. 3. The weight field classes or values may be used to arrange the entries in the CAM based on priority.

A determination may be made of how many entries are associated with each of the weight classes. This may also be referred to as determining the weight depths for the groups of entries stored in the CAM. Based on the size of the individual entries and these weight depths, portions of the CAM may be reserved for storing the entries such that portions corresponding to higher priority positions in the CAM are reserved for higher priority weight classes and portions corresponding to lower priority positions in the CAM are reserved for lower priority weight classes at block 504. To simplify maintenance operations, the entries may comprise a validity bit as discussed above with respect to FIG. 3. Additional invalid entries may be added to one or more weight classes to reserve space for adding new entries in these weight classes without the need to expand their sizes or depths. In other embodiments, depths of the various weight classes may be pre-defined to allow space in the CAM to be reserved in advance thereby obviating the need to analyze the CAM entries at initialization to determine the distribution of the entries among the weight classes.

Figure 6:
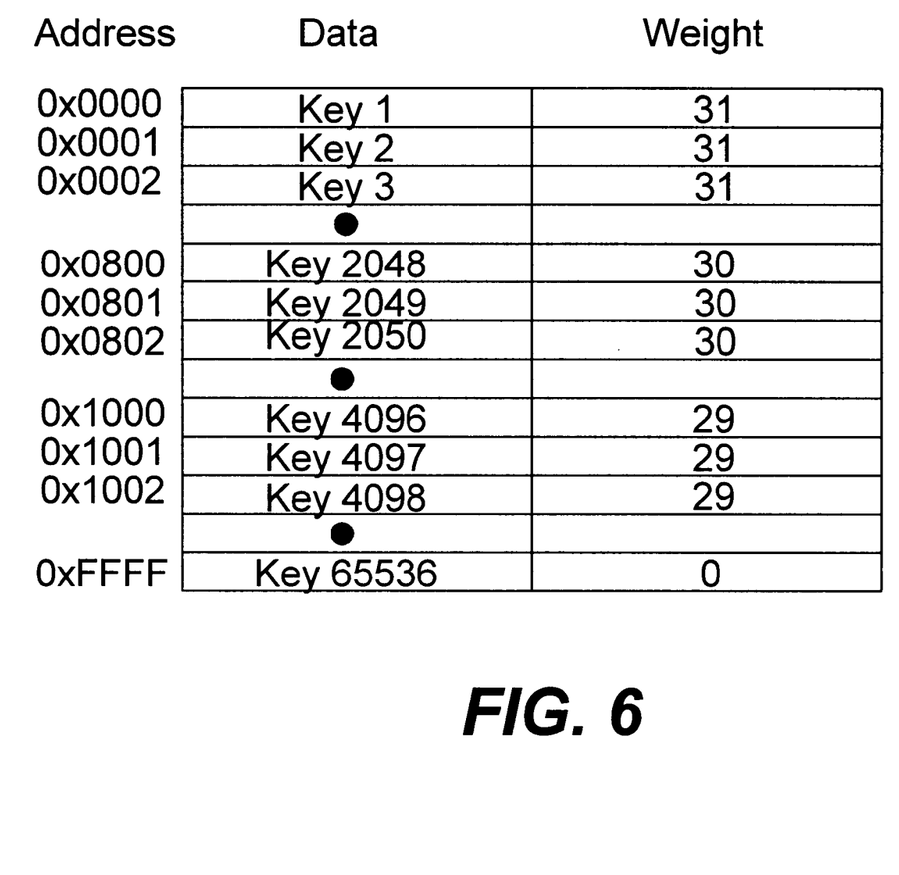
FIGS. 6–8 are block diagrams that illustrate arrangements of exemplary entries in a CAM in accordance with embodiments of the present invention.

At block 506, the entries assigned to a same weight class are arranged in a contiguous portion of the CAM. FIG. 6 illustrates an exemplary arrangement of entries in a CAM in which entries associated with higher priority weight classes are stored at lower address locations and entries associated with lower priority weight classes are stored at higher address locations. Note that all entries having the same weight are contiguous with one another. Note also that the entries are evenly distributed over all weight classes. It should be understood that the entries need not be distributed evenly over all the possible weight classes, in accordance with embodiments of the present invention. Indeed, all entries may be associated with the same weight class if desired.

Figure 7:
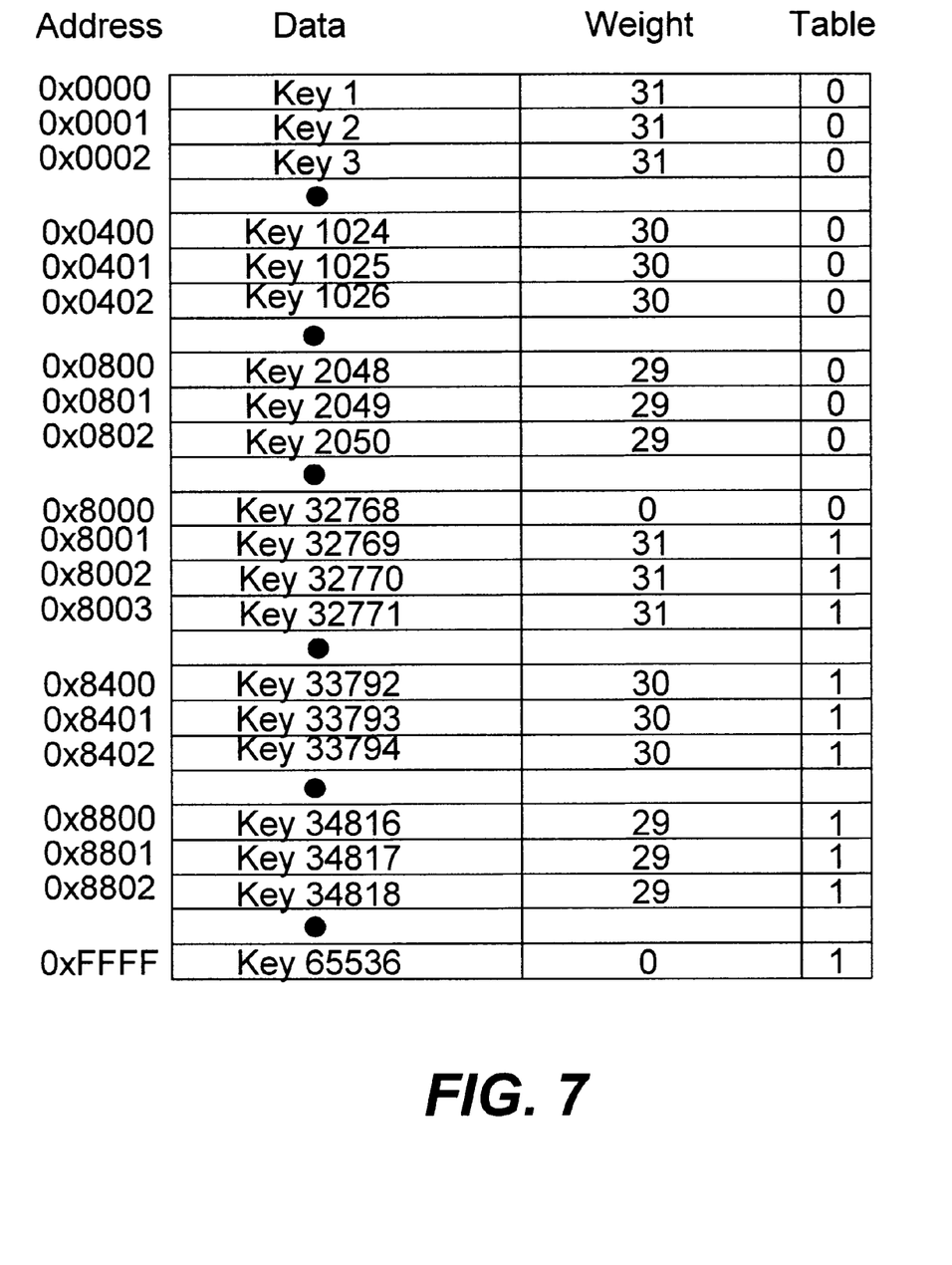
Figure 8:
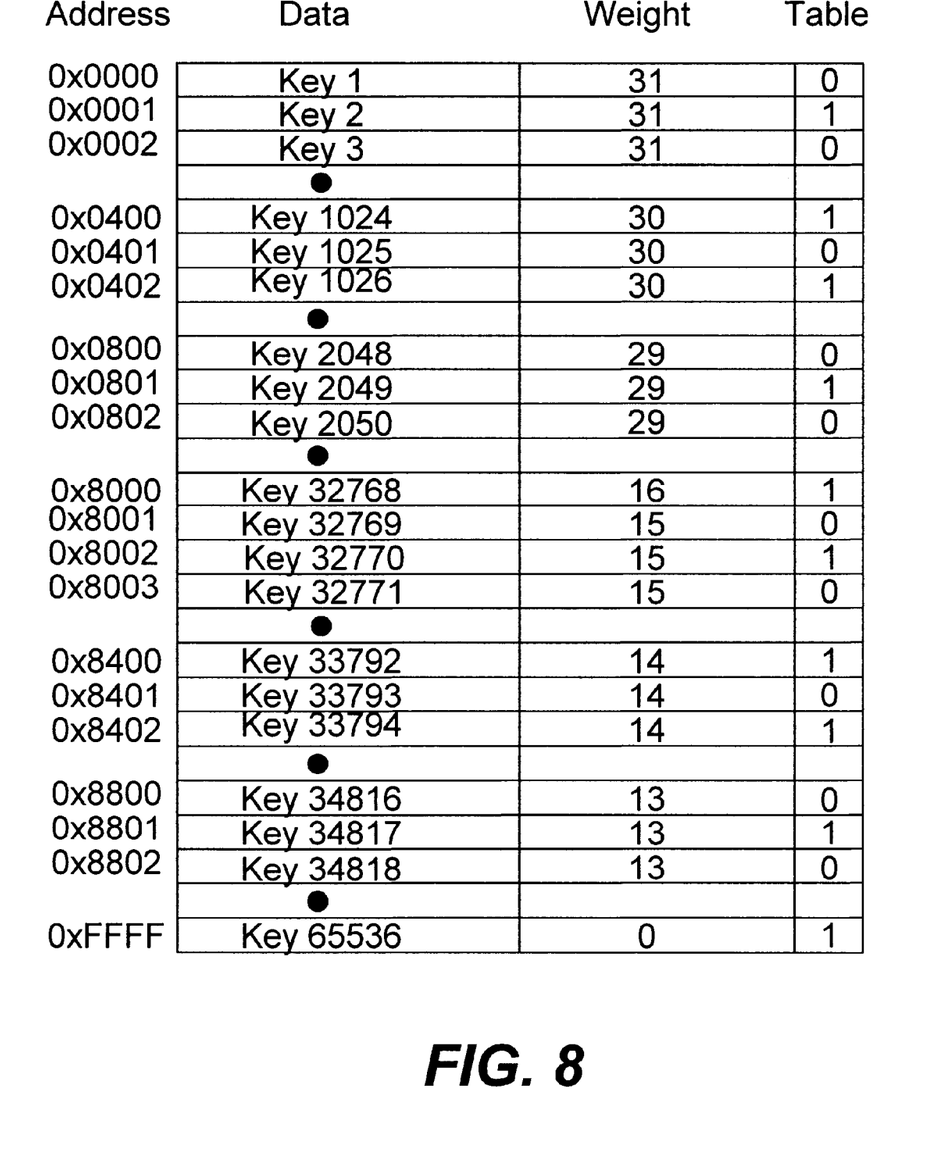

It may be desirable to define logical tables within a CAM. For example, logical tables may be defined for various applications, such as network access control, routing, etc. In accordance with embodiments of the present invention, a CAM entry may be stored with a table field as illustrated in FIG. 3 that specifies a particular logical table for the entry. This is illustrated, for example, in FIG. 7, where the CAM entries are divided into two logical tables corresponding to table values of 0 and 1. Within each logical table, entries having higher priority weights are stored at lower address locations and entries having lower priority weights are stored at higher address locations. As shown in FIG. 7, entries belonging to the same logical table are located in contiguous memory space. In accordance with other embodiments of the present invention illustrated in FIG. 8, entries within a same weight class may be randomly arranged with respect to their table values. In other words, entries having a same weight and table value are stored in a contiguous portion of the CAM memory space.

Figure 9:
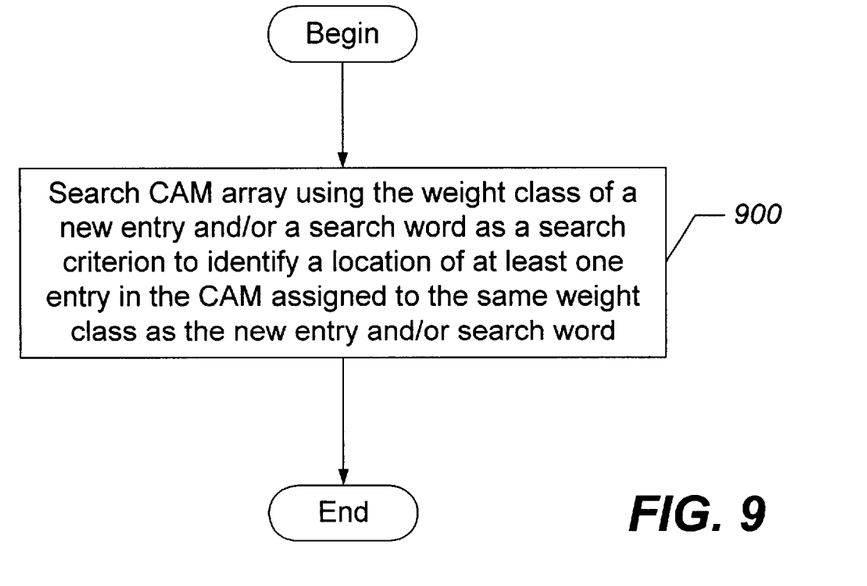
FIGS. 9–11, and 13 are flowcharts that illustrate operations of a CAM having entries with independently searchable weight fields stored therein in accordance with embodiments of the present invention.
Figure 10:
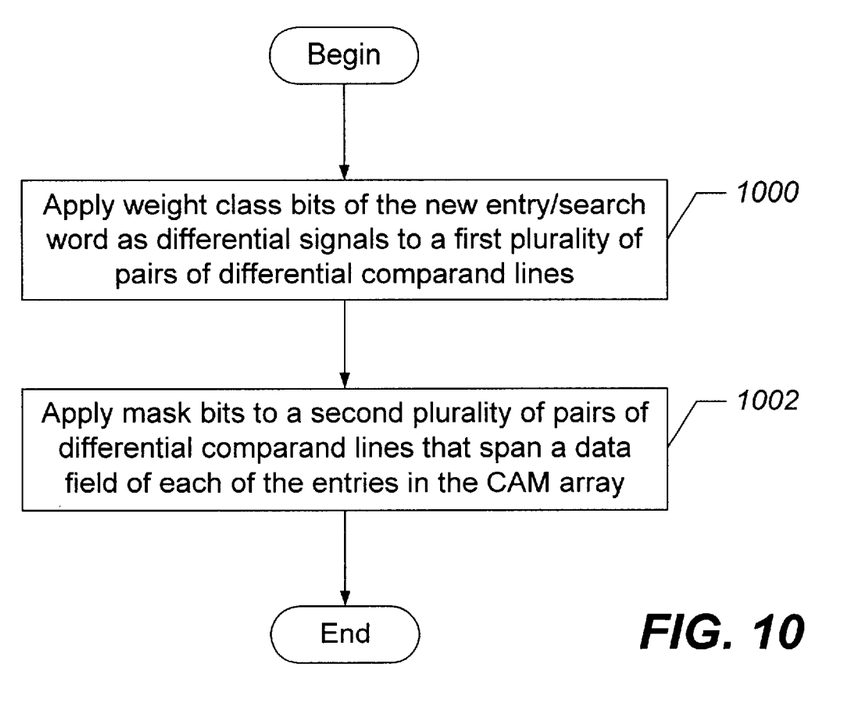

Exemplary operations for searching a CAM, in accordance with embodiments of the present invention, are illustrated in FIGS. 9 and 10. Referring now to FIG. 9, operations begin at block 900 where a CAM array is searched according to a weight class of a new entry to be added to the CAM and/or a search word to identify a location of at least one entry in the CAM assigned to the same weight class as the new entry and/or search word. In contrast with conventional ternary CAMs in which entries are stored in the CAM along with associated mask bits, which may be viewed as providing weights for the entries, the present invention may allow the CAM to be independently searched based on the weight class bits. Thus, a search of the CAM according to the weight class of a new entry and/or a search word may return one or more entries in the CAM that, although belonging to the same weight class as the new entry and/or search word, do not match the new entry and/or search word.

Referring now to FIG. 10, in some embodiments of the present invention, searching a CAM array according to a weight class of a new entry and/or a search word as discussed above with respect to block 900 of FIG. 9 comprises applying weight class bits of the new entry and/or search word as differential signals to a first plurality of pairs of differential comparand lines in the CAM at block 1000 and applying mask bits to a second plurality of pairs of differential comparand lines in the CAM that span a data field of each of the entries in the CAM at block 1002.

Figure 11:
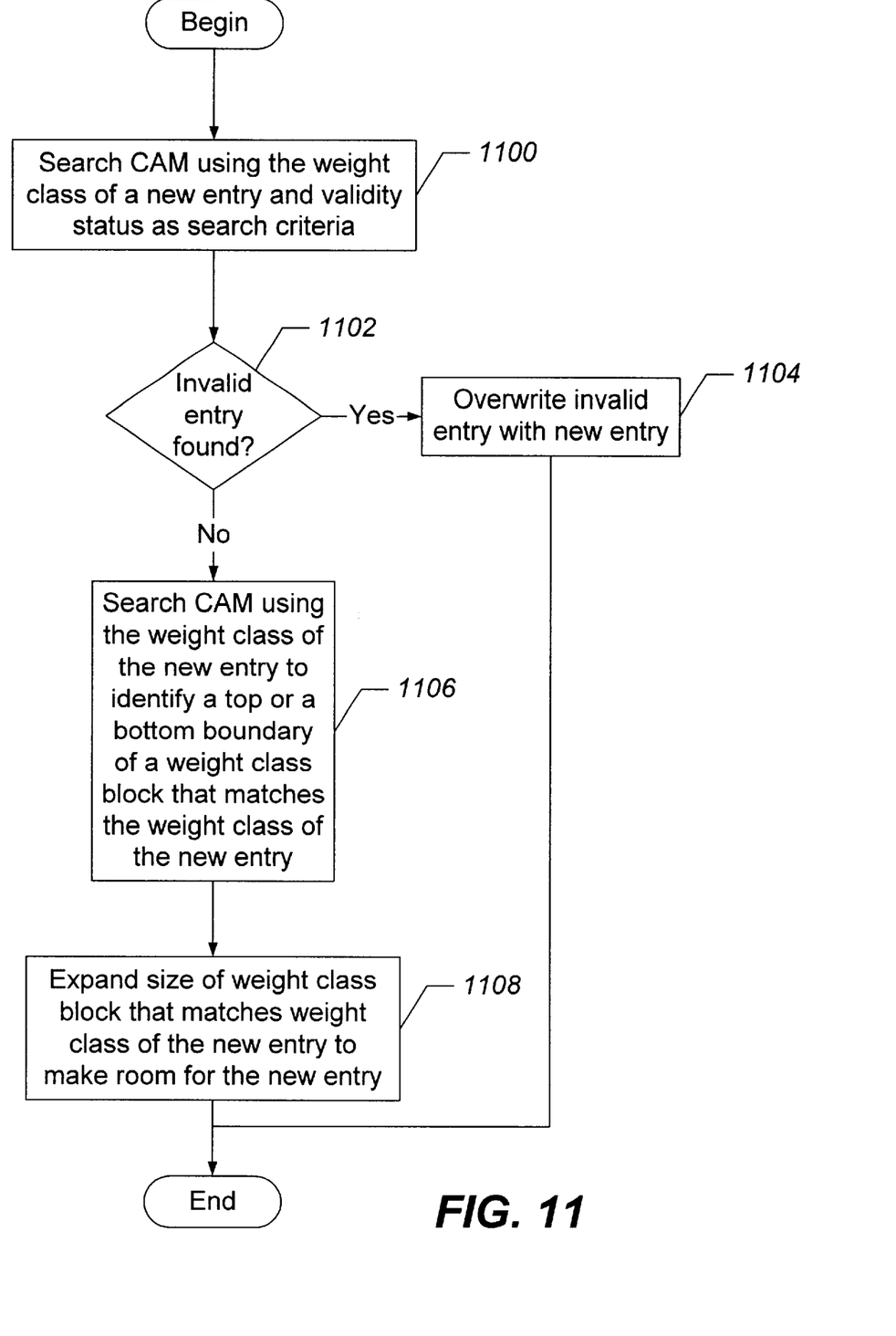
Figure 12:
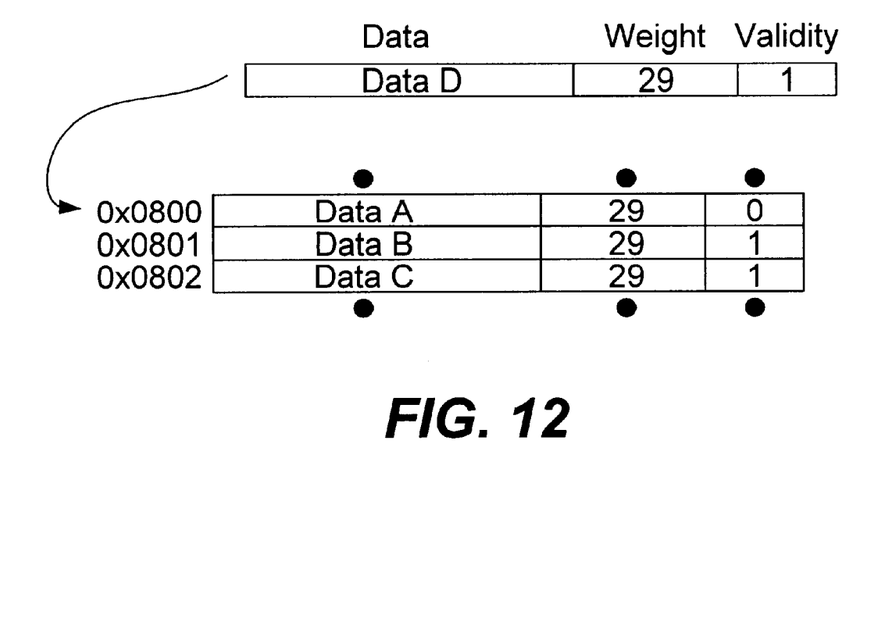
FIG. 12 is a block diagram that illustrates CAM structures and maintenance operations thereof in accordance with embodiments of the present invention.

Exemplary operations for maintaining a CAM, in accordance with embodiments of the present invention, are illustrated in FIGS. 11–15. Referring now to FIG. 11, operations for updating a CAM with a new entry begin at block 1100 where a search of the CAM is performed using the weight class of the new entry and validity status as search criteria. At block 1102, a determination is made whether the search at block 1100 has identified one or more entries in the CAM that belong to the same weight class as the new entry and are currently invalid. These invalid entries may be viewed as empty entries. If one or more entries are determined to be invalid, then any one of these entries may be overwritten with the new entry at block 1104. This is illustrated in FIG. 12, where a new entry belonging to weight class 29 is written into address 0x0800, which contains invalid data, i.e., the validity bit is set to 0.

If, however, it is determined at block 1102 that the CAM contains no invalid entries that belong to the same weight class as the new entry, then operations continue at block 1106 where the CAM is searched using the weight class of the new entry as a search criterion to identify at least a top or a bottom boundary of a weight class block that matches the weight class of the new entry. At block 1108, the size of the weight class block is expanded to make room for the new entry.

Figure 13:
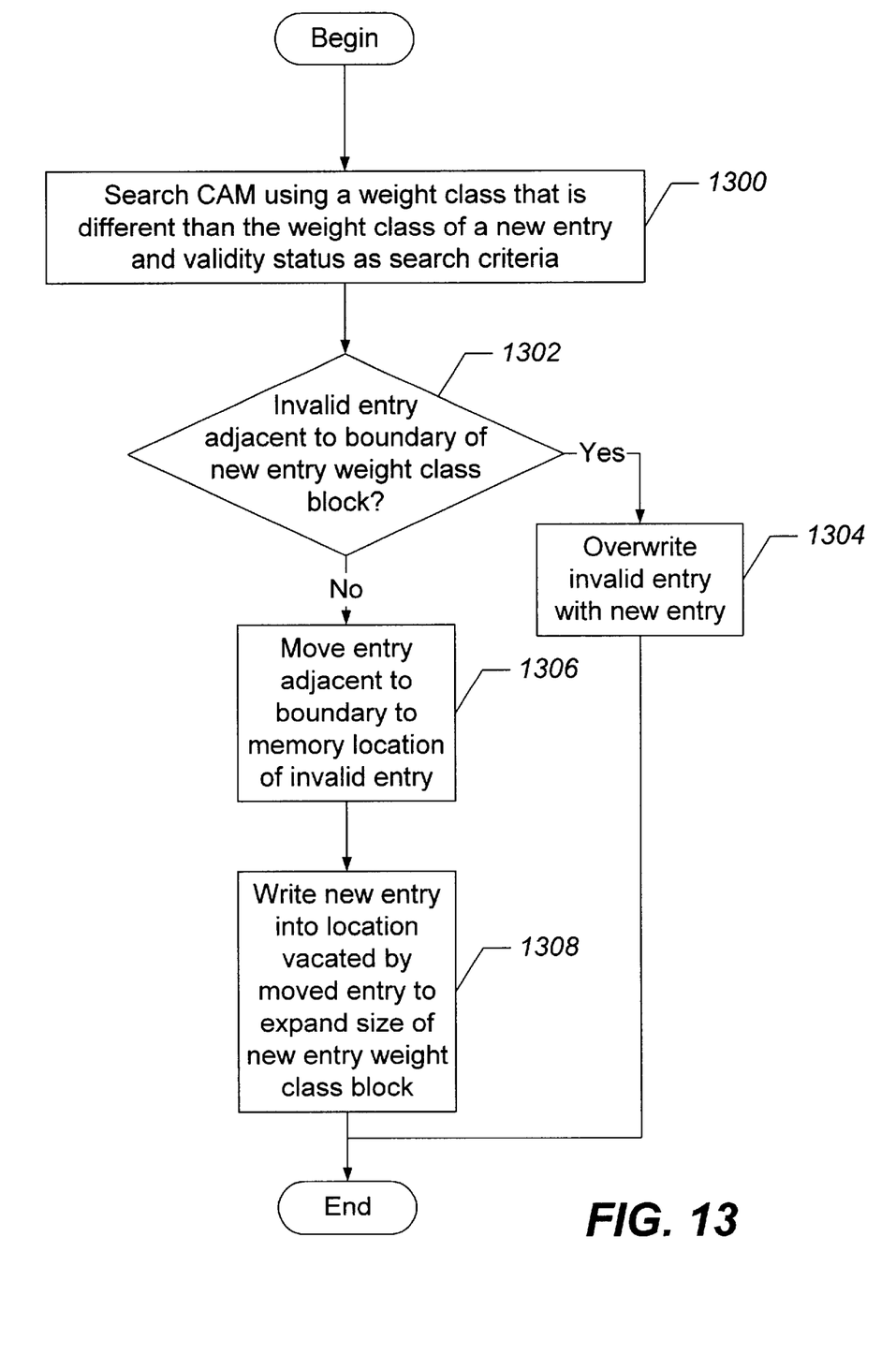

In some embodiments of the present invention illustrated in FIG. 13, the size of the weight class block may be expanded by performing a search of the CAM at block 1300 using a weight class that is different from the weight class of the new entry and validity status as search criteria to identify one or more entries in the CAM that belong to the different weight class and are invalid.

If it is determined at block 1302 that the search at block 1300 identifies an invalid entry that belongs to a weight class different from the new entry and is adjacent to the boundary of the weight class block that matches the new entry, then the size of the weight class block may be expanded at block 1304 by overwriting this invalid entry. If, however, the search at block 1300 identifies an invalid entry that belongs to a weight class that is different from the new entry and is not adjacent to the boundary of the weight class block, then the size of the weight class block that matches the new entry may be expanded at block 1306 by moving an entry that is adjacent to the boundary of the weight class block to the memory location of the invalid entry determined at block 1300, and then writing the new entry into the location formerly occupied by the moved entry at block 1308.

Figure 14:
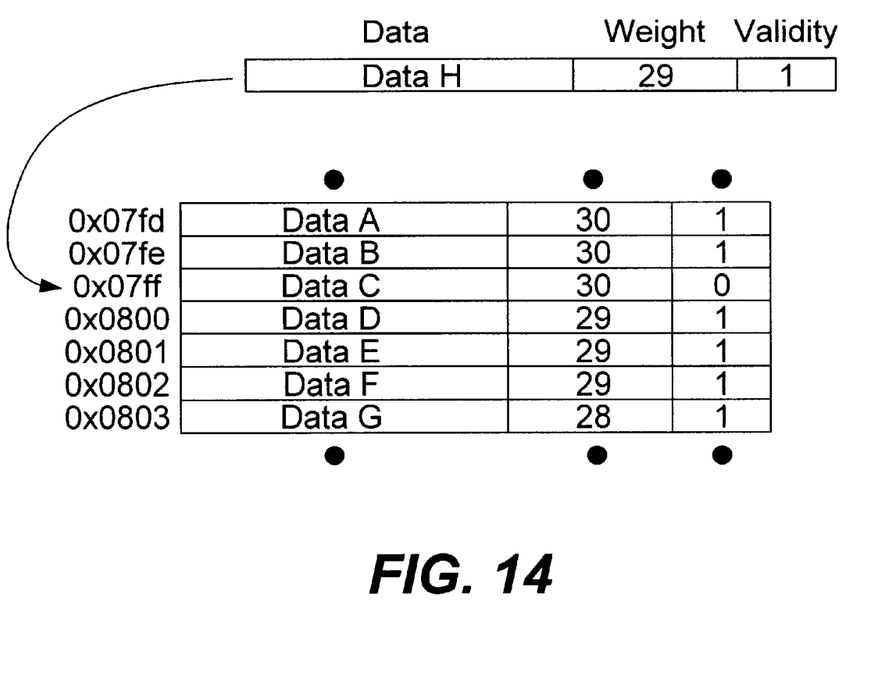
FIGS. 14–15 are block diagrams that illustrate CAM structures and maintenance operations thereof in accordance with embodiments of the present invention.
Figure 15:
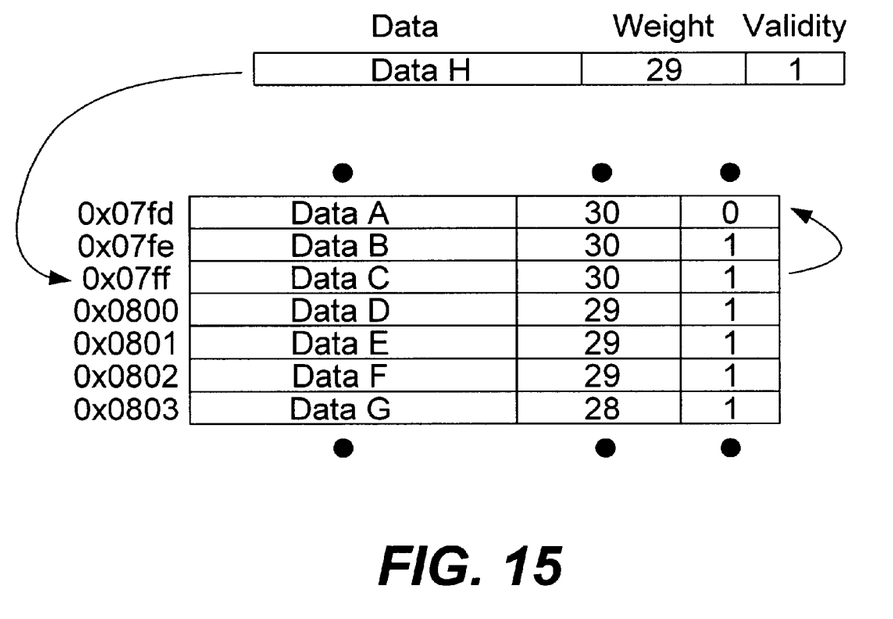

The foregoing operations may be illustrated by way of example. Referring now to FIG. 14, it is desired to write a new entry belonging to weight class 29 into the CAM. Unfortunately, the weight class 29 block does not contain any invalid entries that may be overwritten with the new entry. A search may be performed using weight class 29 as a search criterion to determine address 0x0800 as a top boundary of the weight class 29 block. A search is then performed using weight class 30 and validity status as search criteria to identify address 0x07ff as containing an invalid entry. The size of the weight class 29 block may then be expanded by writing the new entry into the 0x07ff location. Referring now to FIG. 15, it is again desired to write a new entry belonging to weight class 29 into the CAM, but the weight class 29 block does not contain any invalid entries that may be overwritten with the new entry. In contrast with FIG. 14, the entry at location 0x07ff is not invalid. The weight class 30 block, however, contains an invalid entry at location 0x07fd. Thus, the valid entry at location 0x07ff may be moved to location 0x07fd and the new entry may be written into the 0x07ff location to expand the size of the weight class 29 block.

Advantageously, the present invention may allow a host processor running weight priority based application software to use a positional priority based co-processor for performing database searches and/or lookups. Moreover, this "hybrid" system may reduce power usage over conventional weight priority based systems as a priority encoder is no longer needed to select a best match when a search results in multiple matches. In addition, the present invention may allow for the use of larger CAM databases for storing more entries than conventional positional priority based co-processors may allow because memory space need not be allocated for maintaining extensive mappings of where entries are located in the database and also maintaining mappings of logical addresses to physical addresses for the entries.

The flowcharts of FIGS. 5, 9–11, and 13 illustrate the architecture, functionality, and operations of possible embodiments of the CAM of FIG. 4. In this regard, each block may represent a module, segment, or portion of code, which comprises one or more executable instructions for implementing the specified logical function(s). It should also be noted that in some alternative embodiments, the functions noted in the blocks may occur out of the order noted in FIGS. 5, 9–11, and 13. For example, two blocks shown in succession may in fact be executed substantially concurrently or the blocks may sometimes be executed in the reverse order, depending on the functionality involved.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of operating a content addressable memory (CAM) device, comprising the step of:

searching the CAM array according to a weight class of a new entry to be added to the CAM array to thereby identify a location of at least one entry in the CAM array assigned to the same weight class as the new entry, said searching step comprising applying weight class bits of the new entry as differential signals to a first plurality of pairs of differential comparand lines in the CAM array and also applying mask bits to a second plurality of pairs of differential comparand lines in the CAM array that span a data field of the entries in the CAM array.

2. A method of operating a content addressable memory (CAM) device, comprising the step of:

searching the CAM array according to a weight class of a new entry to be added to the CAM array to thereby identify top or bottom boundaries of a group of consecutive entries in the CAM array that have the same weight class as the new entry, said searching step comprising applying weight class bits of the new entry as differential signals to a first plurality of pairs of differential comparand lines in the CAM array and also applying mask bits to a second plurality of pairs of differential comparand lines in the CAM array that span a data field of the entries in the CAM array.

3. A method of operating a content addressable memory (CAM) device, comprising the step of:

searching the CAM array according to a weight class of a search word to identify a location of a top boundary and a location of a bottom boundary of a group of consecutive entries in the CAM array that have the same weight class as the search word, by applying weight class bits of the search word as differential signals to a first plurality of pairs of differential comparand lines in the CAM array and also applying mask bits to a second plurality of pairs of differential comparand lines in the CAM array that span a data field of the entries in the CAM array.

4. A method of operating a content addressable memory (CAM) device, comprising the steps of:

writing entries into a CAM array according to weight class so that entries of the same weight class are grouped together in weight class blocks;

updating the CAM array with a first new entry by:

searching the CAM array according to at least weight class and validity status to identify a first location of an empty entry assigned to the same weight class as the first new entry; and writing the first new entry into the identified first location within the CAM array; and updating the CAM array with a second new entry by:

searching the CAM array according to at least weight class and validity status to determine that no empty entries assigned to the same weight class as the second new entry are present in the CAM array;

searching the CAM array according to at least weight class to identify at least a top or bottom boundary of a weight class block that matches a weight class of the second new entry; and expanding the size of the weight class block to make room for the second new entry.

5. The method of claim 4, wherein expanding the size of the weight class block comprises searching the CAM array according to at least weight class and validity status to identify a second location of an empty entry assigned to a weight class that is different from the weight class of the second new entry.

6. The method of claim 5, wherein expanding the size of the weight class block comprises moving an existing entry in the CAM array from a third location to the second location.

7. The method of claim 5, wherein expanding the size of the weight class block comprises moving an existing entry in the CAM array from a third location to the second location and then writing the second new entry into the third location.

8. An integrated circuit device, comprising:

a content addressable memory (CAM) device having at least one CAM array therein that is configured to support entries arranged in blocks according to weight class, with each of a plurality of the entries having a weight class field, data field and validity field, said at least one CAM array further configured to support an operation to detect a location of an empty entry in a first weight class block by applying the first weight class as a field of a comparand to the at least one CAM array during a search operation while simultaneously globally masking the data field of the at least one CAM array.

9. The device of claim 8, wherein a validity field of the comparand is set to an invalid value during the operation to detect a location of an empty entry.

\* \* \* \* \*